(12) United States Patent
Nemani et al.

(10) Patent No.: US 8,741,775 B2
(45) Date of Patent: Jun. 3, 2014

(54) METHOD OF PATTERNING A LOW-K DIELECTRIC FILM

(75) Inventors: Srinivas D. Nemani, Sunnyvale, CA (US); Yifeng Zhou, Fremont, CA (US); Dmitry Lubomirsky, Cupertino, CA (US); Ellie Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 166 days.

(21) Appl. No.: 13/187,224

(22) Filed: Jul. 20, 2011

(65) Prior Publication Data

US 2013/0023124 A1 Jan. 24, 2013

(51) Int. Cl.
*H01L 21/3105* (2006.01)
(52) U.S. Cl.
USPC .......................................... 438/699; 438/703
(58) Field of Classification Search
CPC .................. H01L 21/31116; H01L 21/31122; H01L 21/31144; H01L 21/0332
USPC .................................................. 438/710, 798
See application file for complete search history.

(56) References Cited

U.S. PATENT DOCUMENTS

| | | | |
|---|---|---|---|
| 2005/0153538 A1* | 7/2005 | Tsai et al. | 438/636 |
| 2007/0032087 A1* | 2/2007 | Nishino et al. | 438/706 |
| 2008/0224273 A1* | 9/2008 | America et al. | 257/622 |
| 2008/0311756 A1* | 12/2008 | Chen et al. | 438/700 |
| 2009/0173718 A1* | 7/2009 | Yun et al. | 216/95 |
| 2009/0229638 A1* | 9/2009 | Yun et al. | 134/26 |

* cited by examiner

*Primary Examiner* — Ha Tran T Nguyen
*Assistant Examiner* — Suberr Chi
(74) *Attorney, Agent, or Firm* — Blakely Sokoloff Taylor & Zafman LLP

(57) ABSTRACT

Methods of patterning low-k dielectric films are described. For example, a method includes forming and patterning a mask layer above a low-k dielectric layer, the low-k dielectric layer disposed above a substrate. Exposed portions of the low-k dielectric layer are modified with a plasma process. The modified portions of the low-k dielectric layer are removed selective to the mask layer and unmodified portions of the low-k dielectric layer.

9 Claims, 8 Drawing Sheets

METHOD OF PATTERNING A LOW-K DIELECTRIC FILM

BACKGROUND

1) Field

Embodiments of the present invention pertain to the field of semiconductor processing and, in particular, to methods of patterning low-k dielectric films.

2) Description of Related Art

In semiconductor manufacturing, a low-k dielectric is a material with a small dielectric constant relative to silicon dioxide. Low-k dielectric material implementation is one of several strategies used to allow continued scaling of microelectronic devices. In digital circuits, insulating dielectrics separate the conducting parts (e.g., wire interconnects and transistors) from one another. As components have scaled and transistors have moved closer together, the insulating dielectrics have thinned to the point where charge build-up and crosstalk adversely affect the performance of the device. Replacing the silicon dioxide with a low-k dielectric of the same thickness reduces parasitic capacitance, enabling faster switching speeds and lower heat dissipation.

However, significant improvements are needed in the evolution of low-k dielectric processing technology.

SUMMARY

Embodiments of the present invention include methods of patterning low-k dielectric films.

In an embodiment, a method includes forming and patterning a mask layer above a low-k dielectric layer, the low-k dielectric layer disposed above a substrate. Exposed portions of the low-k dielectric layer are modified with a plasma process. The modified portions of the low-k dielectric layer are removed selective to the mask layer and unmodified portions of the low-k dielectric layer.

In another embodiment, a method includes forming and patterning a mask layer above a low-k dielectric layer, the low-k dielectric layer disposed above a substrate. A plurality of process cycles is performed to pattern the low-k dielectric layer. Each process cycle includes modifying exposed portions of the low-k dielectric layer with a plasma process, removing the modified portions of the low-k dielectric layer selective to the mask layer and unmodified portions of the low-k dielectric layer, and forming a silicon oxide protecting layer on the mask layer.

DETAILED DESCRIPTION

Methods of patterning low-k dielectric films are described. In the following description, numerous specific details are set forth, such as specific plasma treatments and effects for modifying portions of low-k dielectric films, in order to provide a thorough understanding of embodiments of the present invention. It will be apparent to one skilled in the art that embodiments of the present invention may be practiced without these specific details. In other instances, well-known aspects, such as photolithography patterning and development techniques for mask formation, are not described in detail in order to not unnecessarily obscure embodiments of the present invention. Furthermore, it is to be understood that the various embodiments shown in the Figures are illustrative representations and are not necessarily drawn to scale.

Porous low-k dielectric materials, e.g. porous SiCOH, are typically sensitive to plasma etching. Issues typically arise surrounding damage caused to an Si—$CH_3$ network in an ultra-low-k (ULK) film during an etch process. Such damage may impact the mechanical integrity of a ULK film. Furthermore, there may be an "F memory effect" resulting from polymer formed during a fluorocarbon-based ($C_xF_y$-based) etch process. The sensitivity may also arise from a high porosity which allows etching chemistry to diffuse deep into low-k dielectric film.

One or more embodiments of the present invention are targeted at the fluorocarbon-free etching of low-k dielectric films, such as ULK films. In an embodiment, one or more methods herein are used to provide a patterning approach with reduced damage or detrimental impact to the low k dielectric film, e.g., in an etch patterning process. In one such embodiment, approaches described herein may be particularly useful for C-doped oxide films. Conventional fluorocarbon chemistry-based ULK etching processes inevitably deposit CF polymer on the ULK surfaces. The polymer is subsequently removed with an oxidizing post etch treatment (PET) plasma. However, the PET plasma may oxidize carbon-containing ULK dielectrics. Oxidized carbon-containing ULK dielectrics may be amenable to undesirable moisture absorption, resulting in the dielectric constant (k value) of the ULK dielectrics to increase. In accordance with an embodiment of the present invention, fluorocarbon-free etching of ultra-low k dielectric is described below.

Figure 1:
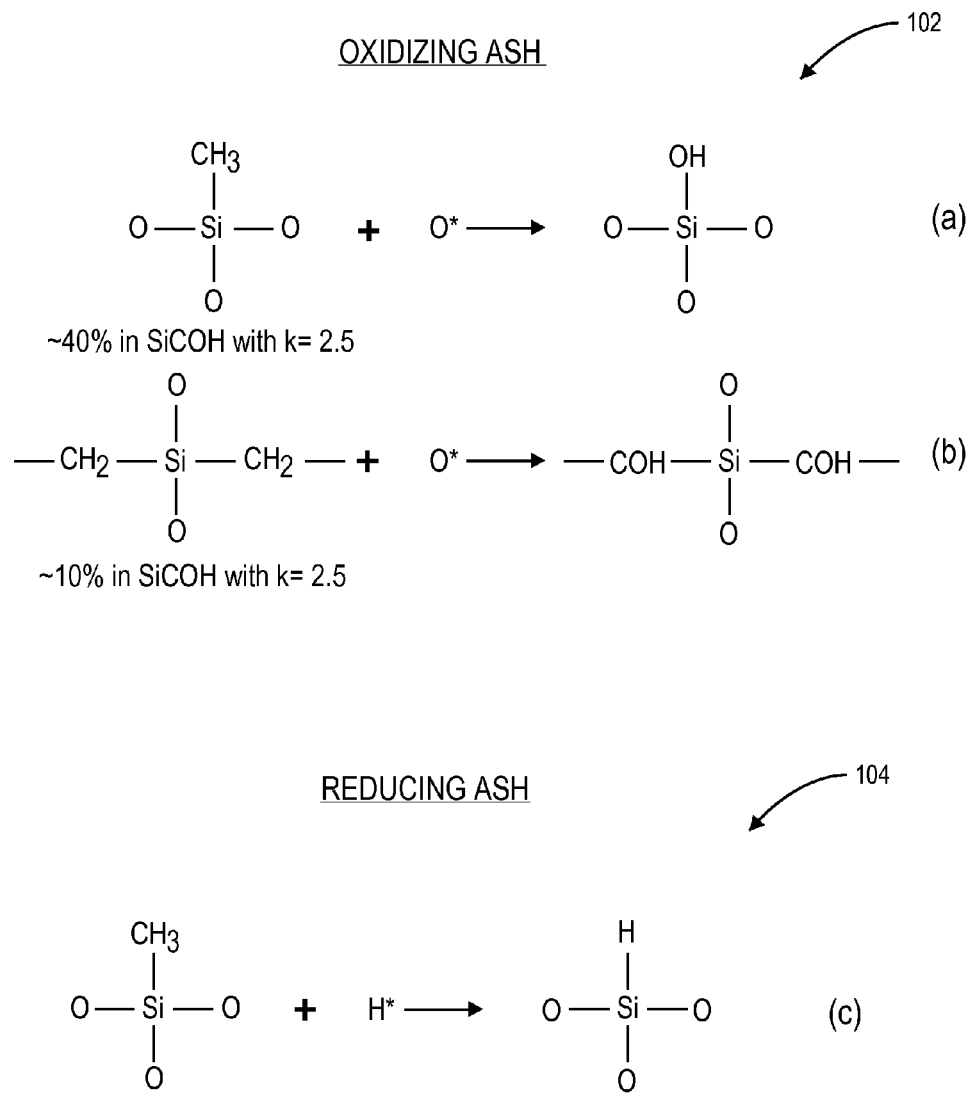
FIG. 1 illustrates mechanisms through which a low-k dielectric layer may be damaged or impacted under conventional oxidizing plasma conditions used to remove polymer formed in a conventional fluorocarbon-based etching process.

FIG. 1 illustrates mechanisms through which a low-k dielectric layer may be damages or impacted under conventional oxidizing plasma conditions used to remove polymer formed in a conventions fluorocarbon-based etching process. Referring to mechanism (a) of FIG. 1, when undergoing an oxidizing ash, an $SiO_3$-methyl fragment, which makes up approximately 40% of a SiCOH low-k film with a dielectric constant of about 2.5, can undesirably lose its methyl group to a hydroxide group. Referring to mechanism (b) of FIG. 1, when undergoing an oxidizing ash, an $SiO_2$—$(CH_2)_2$ fragment, which makes up approximately 10% of a SiCOH low-k film with a dielectric constant of about 2.5, can undesirably be converted to an $SiO_2$—$(COH)_2$ fragment. Referring to mechanism (c) of FIG. 1, when undergoing a reducing ash, an $SiO_3$-methyl fragment, which makes up approximately 40% of a SiCOH low-k film with a dielectric constant of about 2.5, can undesirably lose its methyl group to a hydride ligand (H).

In an embodiment, a fluorocarbon-free etch is used to pattern a low-k dielectric film. Thus, CF polymer doe not form, which would otherwise require removal by an ashing process. In one embodiment, etch processes described herein include two basic operations: (1) modification of an exposed portion of a low-k film through plasma treatment to convert a portion of the film to a silicon oxide (or low-carbon containing oxide), and (2) removal of the treated layer with a dry etch such as a Siconi etch, with HF vapor or with a wet chemistry (such as a dilute hydrofluoric acid treatment). Thus, in an embodiment, a ULK film is not exposed to any halogen radicals or O radicals that may otherwise cause damage to a Si—$CH_3$ network.

Figure 2:
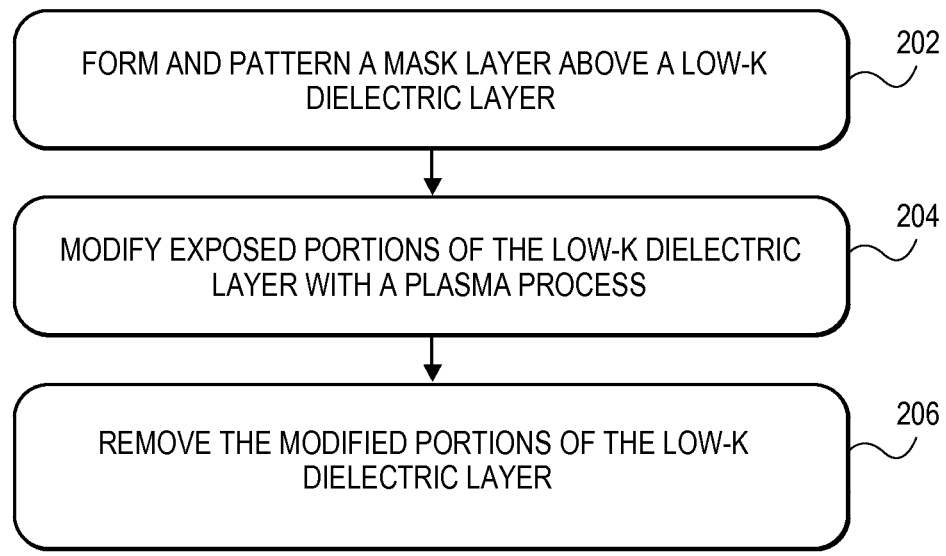
FIG. 2 is a Flowchart representing operations in a method of patterning a low-k dielectric film, in accordance with an embodiment of the present invention.

In an aspect of the present invention, a low-k dielectric film is patterned by modification of a portion of the low-k dielectric film and subsequent removal of the modified portion selective to the unmodified portions of the film. For example, FIG. 2 is a Flowchart 200 representing operations in a method of patterning a low-k dielectric film, in accordance with an embodiment of the present invention. FIGS. 3A-3D illustrate cross-sectional views representing operations in a method of patterning a low-k dielectric film, in accordance with an embodiment of the present invention.

Figure 3A:
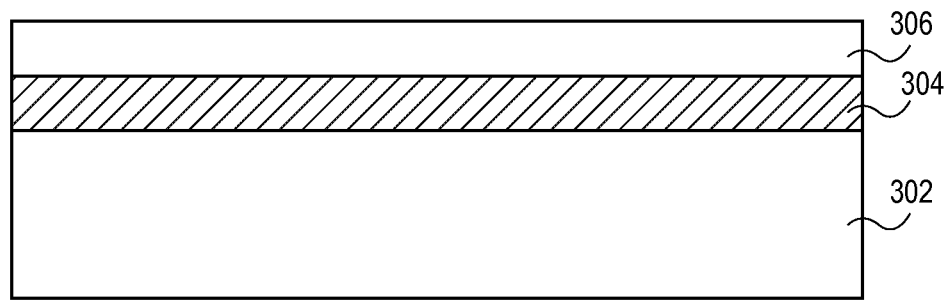
FIGS. 3A-3D illustrate cross-sectional views representing various operations in a method of patterning a low-k dielectric film, corresponding to the Flowchart of FIG. 2, in accordance with an embodiment of the present invention.
Figure 3B:
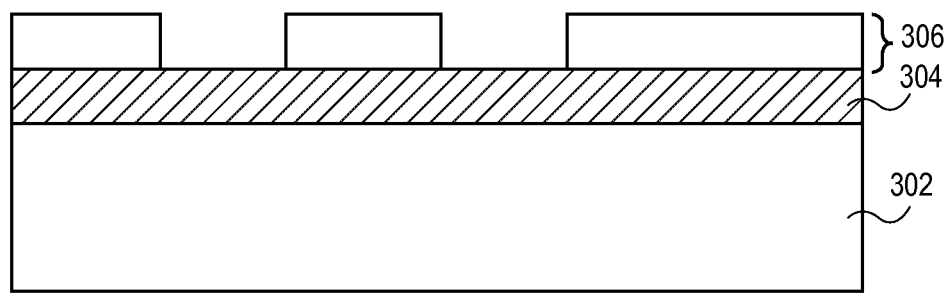

Referring to operation 202 of Flowchart 200 and corresponding FIGS. 3A and 3B, a method of patterning a low-k dielectric film includes forming (FIG. 3A) and patterning (FIG. 3B) a mask layer 306 above a low-k dielectric layer 304, the low-k dielectric layer 304 disposed above a substrate 302. In an embodiment, the mask layer 306 is a photoresist layer formed directly on the low-k dielectric layer 304. In another embodiment, a photoresist layer is first formed above a hardmask layer (306 in this embodiment) disposed above the low-k dielectric layer 304.

In an embodiment, e.g., in the case that mask layer 306 is a hardmask layer that is patterned, forming and patterning the mask layer 306 above the low-k dielectric layer 304 includes forming and patterning a non-oxide mask layer. The non-oxide mask layer may provide selectivity against an oxide etch, as described in greater detail below. In a specific such embodiment, the mask layer 306 is a metal-containing layer such as, but not limited to a layer of titanium nitride or a layer of tantalum nitride. In another specific such embodiment, the mask layer 306 is a layer of non-oxide dielectric material such as, but not limited to, a layer of silicon nitride.

In another embodiment, e.g., in the case that mask layer 306 is a photoresist layer that is patterned, forming and patterning the mask layer 306 above the low-k dielectric layer 304 includes forming and patterning a photoresist layer. The photoresist layer may be composed of a material suitable for use in a lithographic process. That is, in an embodiment, the photoresist layer is exposed to a light source and subsequently developed. In one embodiment, the portions of the photoresist layer to be exposed to the light source will be removed upon developing the photoresist layer, e.g., the photoresist layer is composed of a positive photoresist material. In a specific embodiment, the photoresist layer is composed of a positive photoresist material such as, but not limited to, a 248 nanometer node resist, a 193 nanometer node resist, a 157 nanometer node resist, an extreme ultra-violet (EUV) resist, or a phenolic resin matrix with a diazonaphthoquinone sensitizer. In another embodiment, the portions of the photoresist layer to be exposed to the light source will be retained upon developing the photoresist layer, e.g., the photoresist layer is composed of a negative photoresist material. In a specific embodiment, the photoresist layer is composed of a negative photoresist material such as, but not limited to, poly-cis-isoprene and poly-vinyl-cinnamate.

In an embodiment, the low-k dielectric layer 304 has a permittivity less than that of silicon dioxide, e.g., less than approximately 3.9. In one embodiment, the low-k dielectric layer 304 is a material such as, but not limited to, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric. In accordance with an embodiment of the present invention, the low-k dielectric layer 304 is a porous SiCOH layer having a dielectric constant of less than 2.7.

Substrate 302 may be composed of a material suitable to withstand a fabrication process and upon which semiconductor processing layers may suitably reside. In accordance with an embodiment of the present invention, substrate 302 is composed of a group IV-based material such as, but not limited to, crystalline silicon, germanium or silicon/germanium. In a specific embodiment, providing substrate 302 includes providing a monocrystalline silicon substrate. In a particular embodiment, the monocrystalline silicon substrate is doped with impurity atoms. In another embodiment, substrate 302 is composed of a III-V material. In an embodiment, a plurality of semiconductor devices resides on substrate 302, below low-k dielectric layer 304.

Figure 3C:
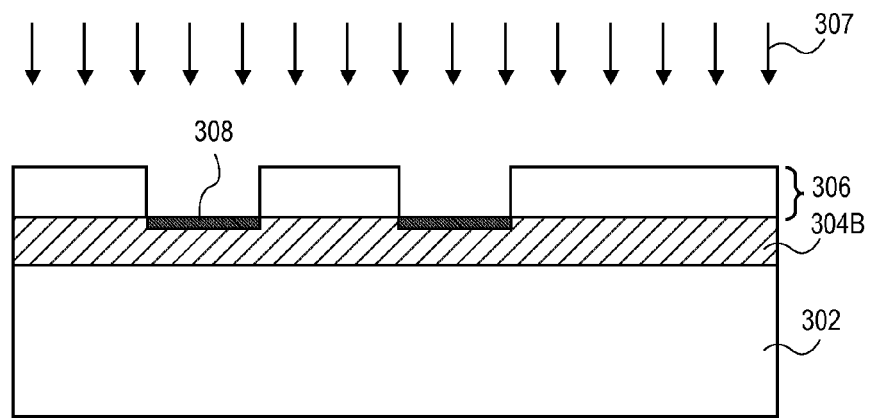

Referring to operation 204 of Flowchart 200 and corresponding FIG. 3C, patterning the low-k dielectric film also includes modifying exposed portions of the low-k dielectric layer 304 with a plasma process 307. The exposed portions of the low-k dielectric layer 304 are those portions exposed by the patterned mask 306. Plasma 307 is used to modify the exposed portions to provide modified portions 308 and unmodified portion 304B of the low-k dielectric layer 304.

In an embodiment, modifying the exposed portions of the low-k dielectric layer 304 with the plasma process 307 involves removing carbon atoms from the exposed portions of the low-k dielectric layer 304. In an embodiment, modifying the exposed portions of the low-k dielectric layer 304 with the plasma process 307 involves increasing the dielectric constant of the exposed portions of the low-k dielectric layer 304. In an embodiment, modifying the exposed portions of the low-k dielectric layer 304 with the plasma process 307 involves using a plasma generated from a gas such as, but not limited to, helium (He), Xenon (Xe), nitrogen ($N_2$), or argon (Ar). It is to be understood that a combination of one or more of the embodiments may be used together in the modification of the exposed portions of the low-k dielectric layer 304.

Figure 3D:
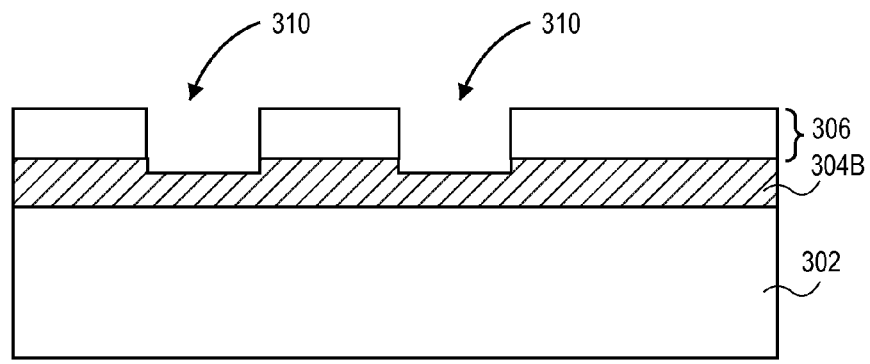

Referring to operation 206 of Flowchart 200 and corresponding FIG. 3D, patterning the low-k dielectric film also includes removing the modified portions 308 of the low-k dielectric layer 304B. In an embodiment, the removal is selective to the mask layer 306 and to the unmodified portions 304B of the low-k dielectric layer 304. Since carbon may be removed during the modification of the low-k dielectric layer 304, the modified portions 308 may be more oxide-like in nature. Accordingly, in an embodiment, an oxide removal process is used to remove the modified portions 308, examples of which are provided below.

In an embodiment, removing the modified portions 308 of the low-k dielectric layer 304 includes exposing the low-k dielectric layer 304 to a second plasma process. In one such embodiment, the second plasma process includes use of a plasma generated from a gas such as, but not limited to, $NF_3$, ammonia ($NH_3$), or a combination thereof. For example, in a specific such embodiment, a "Siconi" dry etch is used and involves (a) etchant generation in the plasma according to $NF_3+NH_3 \rightarrow NH_4F+NH_4F.HF$, (b) etch process at approximately 30 degrees Celsius according to $NH_4F$ or $NH_4F.HF+SiO_2 \rightarrow (NH_4)_2SiF_6$ (solid)$+H_2O$, and (c) sublimation above approximately 100 degrees Celsius according to $(NH_4)_2SiF_6$ (solid)$\rightarrow SiF_4$ (gas)$+(NH_3)$ (gas)$+HF$ (gas). In another such embodiment, removing the modified portions 308 of the low-k dielectric layer 304 includes exposing the low-k dielectric layer 304 to a vapor such as, but not limited to, hydrogen fluoride (HF) vapor or $NF_4.HF$ vapor. In an embodiment, both the modifying and the removing of the exposed portions of the low-k dielectric layer 304, e.g., both operations 204 and 206 of Flowchart 200, are performed in the same process chamber without removing the substrate 302 from the process chamber between the modifying and the removing.

Thus, in accordance with an embodiment of the present invention, etching of a low-k dielectric film is achieved by partial film conversion of the low-k dielectric layer. In one embodiment, the etching may be referred to as atomic layer etching or molecular level etching (MLE) since only one or a few layers of exposed portions of the low-k dielectric film are converted and subsequently removed per process cycle. As exemplified above, in one embodiment, the etching process includes first selectively modifying the composition of a horizontal ULK surface with an inert plasma. Highly directional ions from the plasma generated with low pressure inert gas (e.g., Ar, He, $N_2$, Xe) are used to extract carbon from horizontal ULK surface. The removed carbon may redeposit on vertical ULK surfaces, forming a passivation layer. Then, the carbon depleted dielectric portion is selectively removed from the horizontal ULK surface. In an embodiment, reacting species from a $NH_3/NF_3/He$ plasma is used to remove the modified ULK surface layer, as well as sacrificial silicon oxide which may be used for mask protection, as described in greater detail below. In one embodiment, approaches described herein represent true film conversion by methyl knock-off from a low-k dielectric film. The resulting modified film may be removed with an oxide-like etch with selectivity to a non-oxide masking layer.

By contrast, conventional chemical etching typically involves deposition of polymer on ULK surfaces, which are removed with an oxidizing PET operation. An aqueous-based clean is used to remove damaged ULK, which may result in line bending and moisture absorption into the ULK. Instead, in an embodiment herein, essentially damage free etching of a ULK material is achieved by completely avoiding CF etching chemistry. An inert plasma is used to remove carbon from a ULK surface. A downstream plasma is then used to remove modified portions of the ULK. The downstream plasma etching may be extremely selective to the ULK due to its nature of pure chemical etching.

The above method described in association with operations 204 and 206 of Flowchart 200 may be repeated as required to achieve a suitable extent of patterning of the low-k dielectric layer 304. For example, referring again to FIG. 3D, trenches 310 are formed in the low-k dielectric layer 304, leaving partially patterned, and unmodified, low-k dielectric layer 304B. The depth of trenches 310 may not be deep enough for suitable patterning of the low-k dielectric layer 304, especially since the modification and removal process described above may only remove one or several molecular layers at a time.

Accordingly, in an embodiment, the low-k dielectric layer 304 is subjected to multiple modification and removal processes of exposed portions thereof until a depth of trenches 310 suitable for subsequent processing requirements is achieved. In one such embodiment, the modifications and removal is repeated until partial trenches are formed in, but not entirely through, the low-k dielectric layer 304. In another such embodiment, the modifications and removal is repeated until complete trenches are formed entirely through the low-k dielectric layer 304.

As an example of a cyclic process, FIGS. 4A-4D illustrate an embodiment in which, in conjunction with FIGS. 3A-3D, a total of two cycles are performed to pattern a low-k dielectric layer. It is to be understood that many more than two modification and removal cycles may need to be performed to suitably pattern a low-k dielectric film.

Figure 4A:
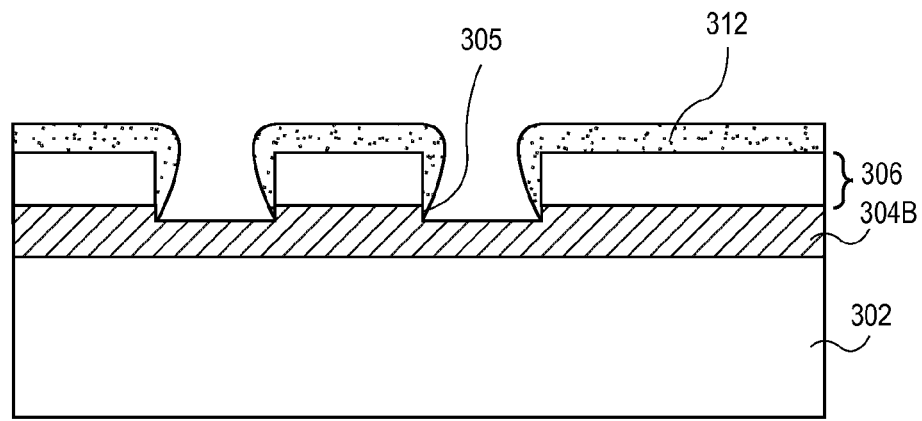
FIGS. 4A-4D illustrate cross-sectional views representing various operations in another method of patterning a low-k dielectric film, in accordance with an embodiment of the present invention.

Referring to FIG. 4A, starting with the structure provided in FIG. 3D, prior to applying a second modification and removal process, in an optional embodiment, sidewalls of the unmodified portions of the partially patterned low-k dielectric layer are protected with a protection layer. Specifically, in an embodiment, a protecting layer 312 is formed on the on the mask layer 306 and at least partially along the sidewalls 305 of the unmodified portions 304B of the low-k dielectric layer 304. The protecting layer 312 may be used to provide sidewall 305 protection of the unmodified portions 304B of the low-k dielectric layer 304 during a subsequent modification process. By providing sidewall 305 protection, in one embodiment, undercut of the low-k dielectric layer 304 underneath the mask layer 306 may be mitigated or hindered altogether.

In an embodiment, the protecting layer 312 is a silicon oxide protecting layer. In one such embodiment, the silicon oxide protecting layer 312 is formed from a plasma derived from an oxygen radical source and a silicon source. In a specific such embodiment, the oxygen radical source is a molecule with a dissociation product including an oxygen radical. The oxygen radical source is one such as, but not limited to, oxygen ($O_2$), ozone ($O_3$), carbon dioxide ($CO_2$), or water ($H_2O$). The silicon source is a molecule that reacts with an oxygen radical to form a silicon oxide layer. The silicon source is one such as, but not limited to, silicon tetrafluoride ($SiF_4$), silicon tetrachloride ($SiCl_4$), silane ($SiH_4$), dimethylsilane (($CH_3)_2SiH_2$), trimethylsilane (($CH_3)_3SiH$), octamethylcyclotetrasiloxane, or N-(Trimethylsilyl)dimethylamine (($CH_3)_3SiN(CH_2)_2$).

Figure 4B:
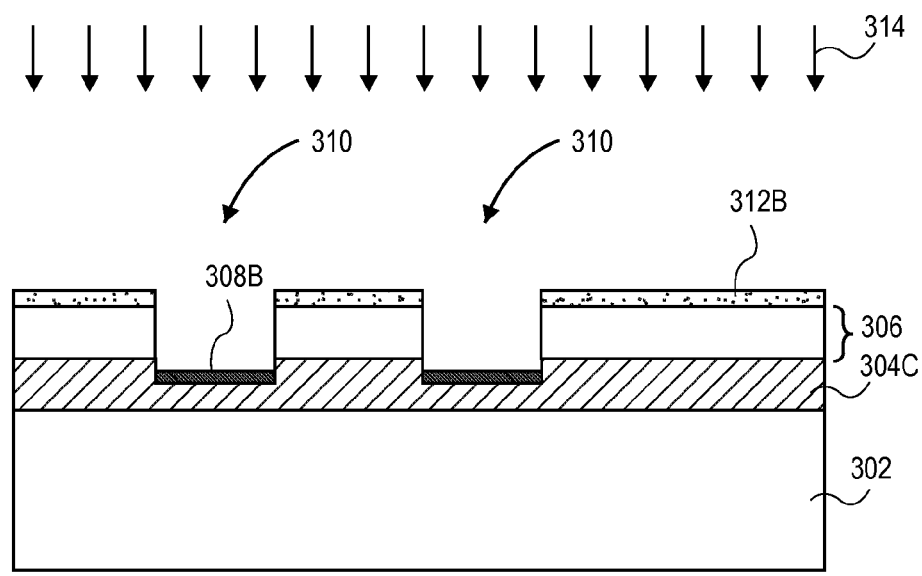

Referring to FIG. 4B, exposed portions of the low-k dielectric layer 304B, e.g., exposed surfaces of trenches 310, are modified with a second modification plasma process 314. The exposed portions of the low-k dielectric layer 304B are those portions exposed by the patterned mask 306 as well as sidewalls 305. Plasma 314 is used to modify the exposed portions to provide second modified portions 308B and second unmodified portion 304C of the low-k dielectric layer 304.

In an embodiment, modifying the exposed portions of the low-k dielectric layer 304B with the plasma process 314 involves removing carbon atoms from the exposed portions of the low-k dielectric layer 304B. In an embodiment, modifying the exposed portions of the low-k dielectric layer 304B with the plasma process 314 involves increasing the dielectric constant of the exposed portions of the low-k dielectric layer 304B. In an embodiment, modifying the exposed portions of the low-k dielectric layer 304B with the plasma process 314 involves using a plasma generated from a gas such as, but not limited to, helium (He), Xenon (Xe), nitrogen ($N_2$), or argon (Ar). It is to be understood that a combination of one or more of the embodiments may be used together in the modification of the exposed portions of the low-k dielectric layer 304B.

Furthermore, referring again to FIG. 4B, the protecting layer 312 may be partially etched to a reduced the protecting layer 312B during the modifying of the exposed portions of the low-k dielectric layer 304B with the plasma process 314. That is, the protecting layer 312 may not be entirely selective against the plasma 314. Nonetheless, the etch of the protecting layer 312 to the reduced the protecting layer 312B is, in one embodiment, sufficiently slow as to provide protection for sidewalls 305 during the second modification operation, effectively protecting the sidewalls 305 from undesired modification and, possibly, undesired undercut formation.

Figure 4C:
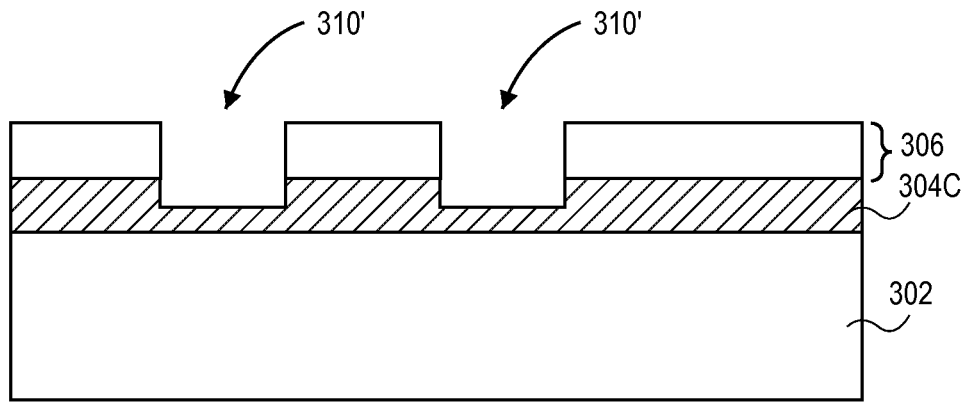

Referring to FIG. 4C, the second modified portions 308B are removed from the remaining portions 304C of the low-k dielectric layer 304. In an embodiment, the removal is selective to the mask layer 306 and to the unmodified portions 304C of the low-k dielectric layer 304. Since carbon may be removed during the modification of the low-k dielectric layer 304B, the second modified portions 308B may be more oxide-like in nature. Accordingly, in an embodiment, an oxide removal process is used to remove the second modified portions 308B, examples of which are provided below.

In an embodiment, removing the second modified portions 308B of the low-k dielectric layer 304 includes exposing the low-k dielectric layer 304 to another plasma process. In one such embodiment, the plasma process includes use of a plasma generated from a gas such as, but not limited to, $NF_3$, ammonia ($NH_3$), or a combination thereof. For example, in a specific such embodiment, a "Siconi" dry etch is used, as described above. In another such embodiment, removing the second modified portions 308B of the low-k dielectric layer 304 includes exposing the low-k dielectric layer 304 to a vapor such as, but not limited to, hydrogen fluoride (HF) vapor or $NF_4.HF$ vapor. In an embodiment, the removal of 308B extends trenches 310 to form deeper trenches 310', as depicted in FIG. 4C.

Figure 4D:
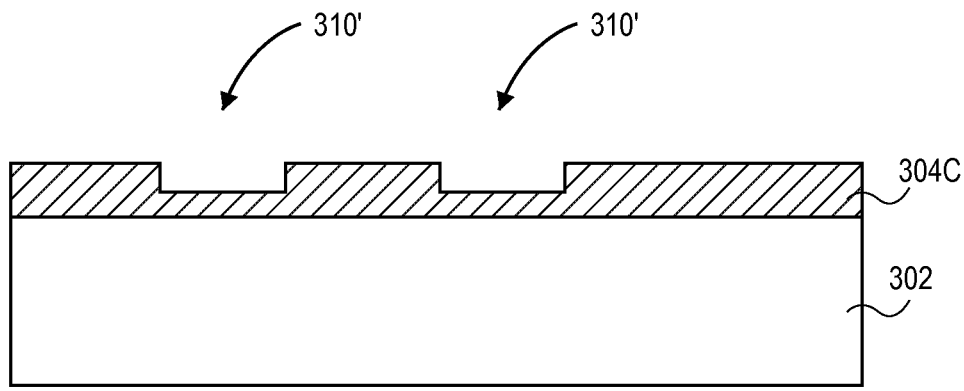

Referring to FIG. 4D, once a desired depth for trenches 310' is achieved, which may involve numerous cycles of the above described modification and removal process, the mask 306 may be removed. However, in an embodiment, care must be taken upon removal of mask 306 such that the removal is selective against the patterned low-k dielectric layer 304C and does not detrimentally impact (e.g., by raising the dielectric constant) the patterned low-k dielectric layer 304C.

In an embodiment, the mask layer 306 is composed of a photoresist material and is removed in an ashing process. However, in one embodiment, the ashing plasma is applied in a manner to limit ashing damage to the patterned low-k dielectric layer 304C. In a specific such embodiment, although there may be similarities in the composition of a photoresist-based mask layer 306 and the patterned low-k dielectric layer 304C, the differences are exploited for a selective removal of the mask layer 306. For example, an organic mask may include a hydrocarbon polymer (including the elements C, H, O), where an etch thereof may depend more on neutrals species rather than on ions. Meanwhile, the patterned low-k dielectric layer 304C may include an O—Si—O network with Si—$CH_3$ groups, where an etch thereof may require some ion energy and neutrals to induce damage. Approaches for selective removal of the mask layer 306 may, in an embodiment, include increasing ashing selectivity to the patterned low-k dielectric layer 304C by high ion/neutral ratio which may remove the organic mask on horizontal surfaces while preserving the patterned low-k dielectric layer 304C on vertical surfaces.

In accordance with another embodiment of the present invention, a cyclic passivation and ashing approach is used to reduce ashing damage typically associated with removal of a photoresist layer from an exposed or partially exposed low-k dielectric layer. In one such embodiment, a process scheme includes alternating steps of passivation and ashing. During each of the passivation operations, a silicon-containing passivation agent is used to selectively react with an ultra low-k (ULK) material to form a thin layer of silicon-containing film on exposed portions of the ULK material. During each of the ashing operations, the thin layer of silicon-containing film acts to protect against an ashing plasma, e.g., which may be used to etch a photoresist layer. The protecting reduces damage that the ashing plasma would otherwise cause to the ULK material. The protecting nature of the passivating layer may be considered to be in situ, in the sense that the film may form Si—O linkages upon exposure to the ashing plasma. The Si—O linkages may provide selectivity against the ashing plasma.

The passivation layer may be removed or at least somewhat compromised during the ashing by chemical reaction or physical sputtering. Accordingly, in one embodiment, cyclic passivation/ashing operations are used. Such cyclic passivation/ashing operations may be repeated until all organic mask material (e.g., an overlying photoresist layer) is removed. Any remaining portions of the passivation layer may be removed, e.g., in one embodiment, by a diluted hydrofluoric acid (HF) clean.

In a specific embodiment, in order to form a passivation layer for protecting the patterned low-k dielectric layer 304C during removal of the mask layer 406, a silicon source layer is first formed on the surfaces of the trenches 310' of the patterned low-k dielectric layer 304C. In an embodiment, the silicon source layer is formed from molecular species that react with a hydrolyzed portion of the patterned low-k dielectric layer 304C. In one embodiment, the silicon source layer forms a covalent bond between the silicon source layer and the exposed portions of the patterned low-k dielectric layer 304C. In one embodiment, the silicon source layer is formed from a species such as, but not limited to, silicon tetrachloride ($SiCl_4$), dimethylsilane (($CH_3)_2SiH_2$), trimethylsilane (($CH_3)_3SiH$), N-(trimethylsilyl)dimethylamine (($CH_3)_3SiN(CH_2)_2$), or 1,1,1,3,3,3-hexamethyldisilazane (HMDS). In one embodiment, the substrate 302 is situated on a hot plate during the forming of the silicon source layer.

Next, the silicon source layer is exposed to an oxygen source to form an Si—O-containing layer on the surfaces of the trenches 310' of the patterned low-k dielectric layer 304C and to remove at least a portion of the photoresist-based mask layer 306. In an embodiment, the Si—O-containing layer protects the patterned low-k dielectric layer 304C during removal of some or all of the mask layer 306. It is to be understood that, in the absence of the Si—O-containing layer, the patterned low-k dielectric layer 304C may otherwise be damaged by the process used to remove the portion of the mask layer 306. In an embodiment, exposing the silicon source layer to an oxygen source includes treating with a plasma. In one embodiment, the plasma is based on an oxygen radical source. The oxygen radical source is a molecule with a dissociation product composed of an oxygen radical. In a specific such embodiment, the oxygen radical source is a source such as, but not limited to, oxygen ($O_2$), ozone ($O_3$), carbon dioxide ($CO_2$), or water ($H_2O$). In an embodiment, subsequent to the removal of the mask layer 306 the Si—O-containing layer is removed. In one such embodiment, the Si—O-containing layer is removed by a dry etch process. In another embodiment, a wet etch solution including hydrofluoric acid (HF) is used to remove the Si—O-containing layer. However, it is to be understood that no such additional treatment may be needed. For example, in one embodiment, the Si—O-containing layer is removed during the ashing by chemical reaction or physical sputtering.

In an embodiment, one or more of the above processes is performed in a plasma etch chamber. For example, in one embodiment, one or more of the above processes is performed in an Applied Centura® Enabler dielectric etch system, available from Applied Materials of Sunnyvale, Calif., USA. In another embodiment, one or more of the above processes is performed in an Applied Materials™ Advant-Edge G3 etcher, also available from Applied Materials of Sunnyvale, Calif., USA.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 5:
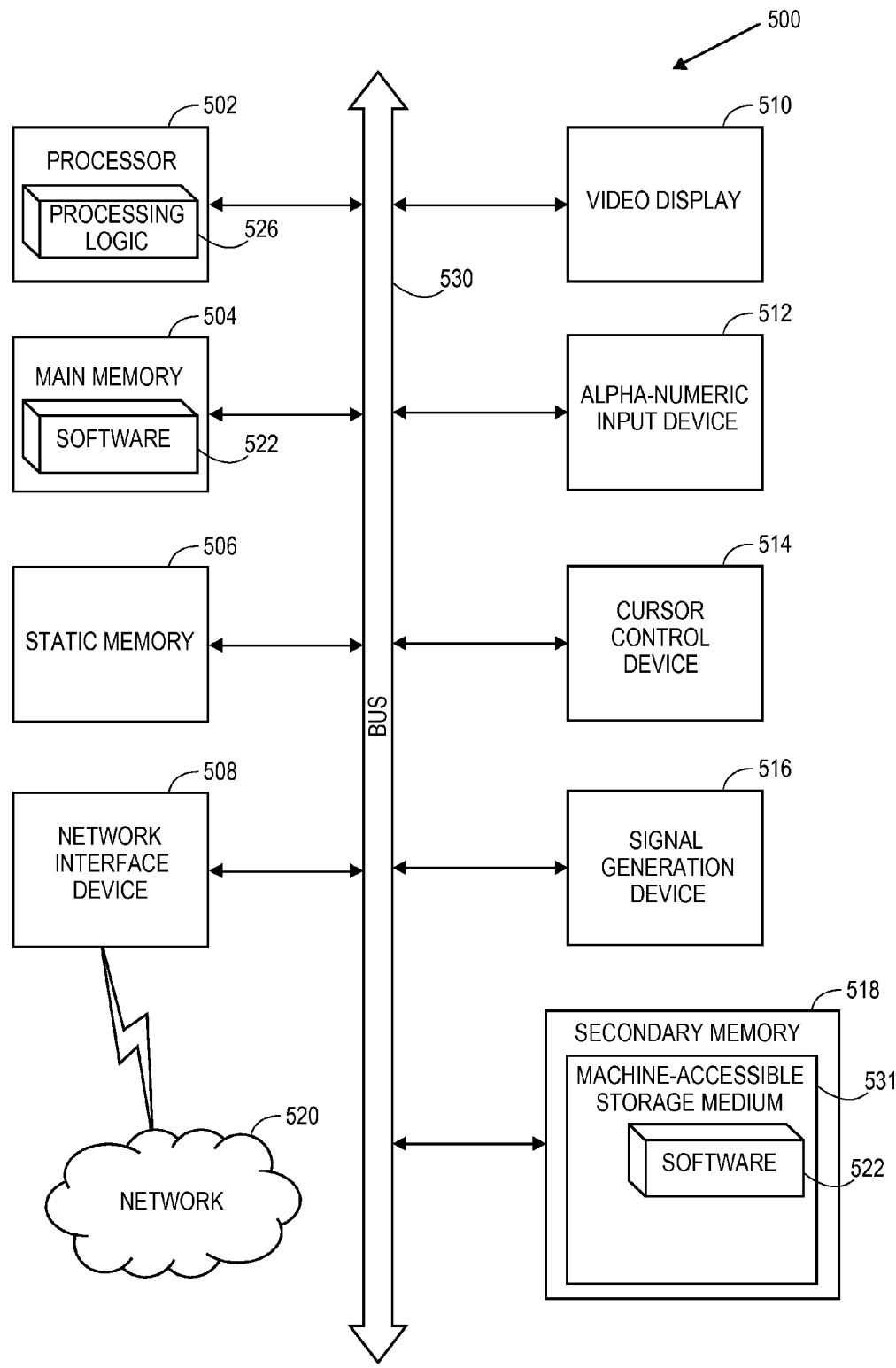
FIG. 5 illustrates a block diagram of an exemplary computer system, in accordance with an embodiment of the present invention.

FIG. 5 illustrates a diagrammatic representation of a machine in the exemplary form of a computer system 500 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations discussed herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of patterning a low-k dielectric layer. The method includes forming and patterning a mask layer above a low-k dielectric layer, the low-k dielectric layer disposed above a substrate. Exposed portions of the low-k dielectric layer are modified with a plasma process. The modified portions of the low-k dielectric layer are removed selective to the mask layer and unmodified portions of the low-k dielectric layer.

Patterning of a low-k dielectric layer may be conducted in processing equipment suitable to provide an etch plasma in proximity to a sample for etching. For example, FIG. 6 illustrates a system in which a method of low-k dielectric film patterning is performed, in accordance with an embodiment of the present invention.

Figure 6:
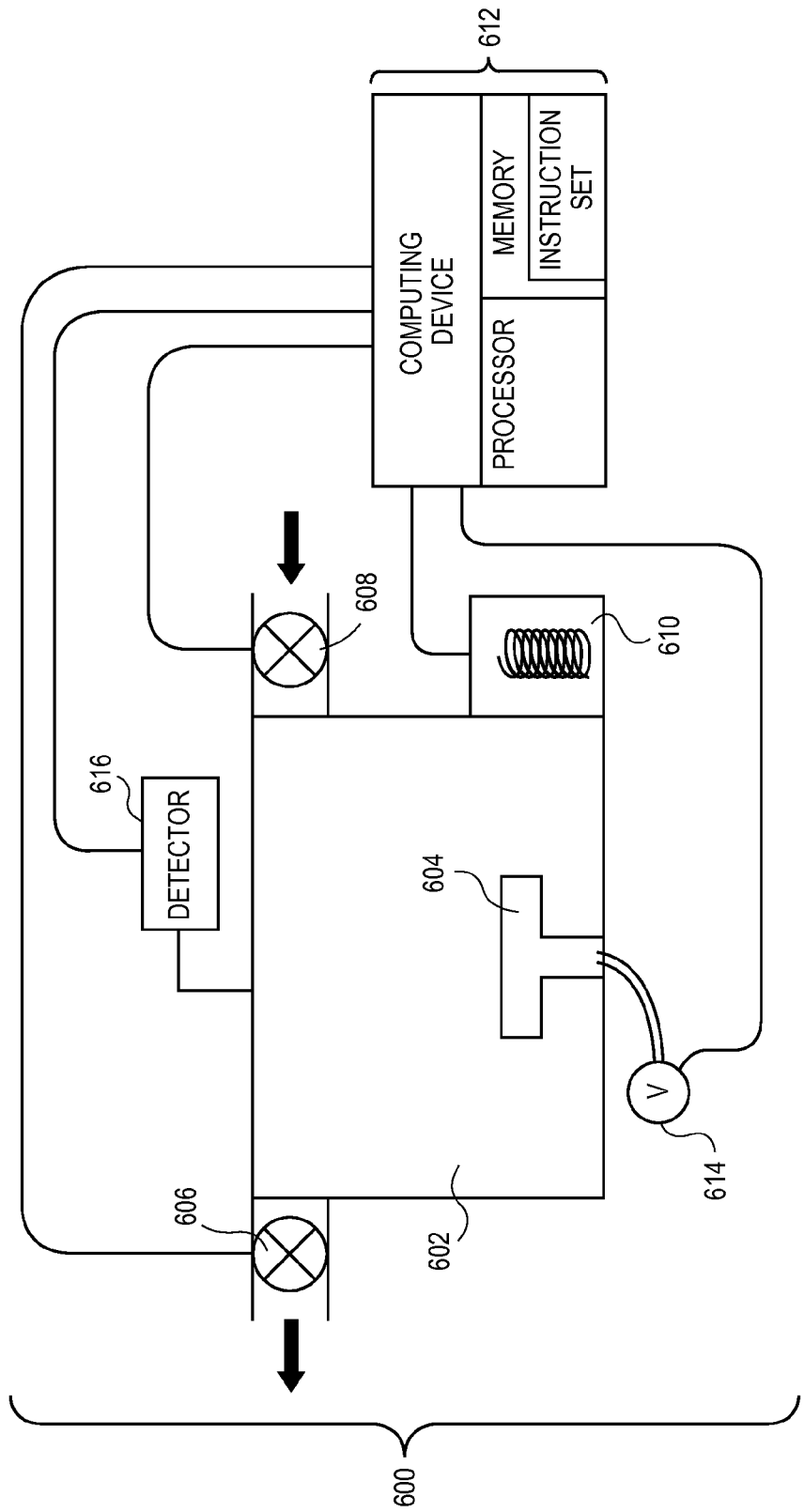
FIG. 6 illustrates a system in which a method of low-k dielectric film patterning is performed, in accordance with an embodiment of the present invention.

Referring to FIG. 6, a system 600 for conducting a plasma etch process includes a chamber 602 equipped with a sample holder 604. An evacuation device 606, a gas inlet device 608 and a plasma ignition device 610 are coupled with chamber 602. A computing device 612 is coupled with plasma ignition device 610. System 600 may additionally include a voltage source 614 coupled with sample holder 604 and a detector 616 coupled with chamber 602. Computing device 612 may also be coupled with evacuation device 606, gas inlet device 608, voltage source 614 and detector 616, as depicted in FIG. 6.

Chamber 602 and sample holder 604 may include a reaction chamber and sample positioning device suitable to contain an ionized gas, i.e. a plasma, and bring a sample in proximity to the ionized gas or charged species ejected therefrom. Evacuation device 606 may be a device suitable to evacuate and de-pressurize chamber 602. Gas inlet device 608 may be a device suitable to inject a reaction gas into chamber 602. Plasma ignition device 610 may be a device suitable for igniting a plasma derived from the reaction gas injected into chamber 602 by gas inlet device 608. Detection device 616 may be a device suitable to detect an end-point of a processing step. In one embodiment, system 600 includes a chamber 602, a sample holder 604, an evacuation device 606, a gas inlet device 608, a plasma ignition device 610 and a detector 616 similar to, or the same as, those included in an Applied Centura® Enabler dielectric etch system or an Applied Materials™ AdvantEdge G3 system.

Thus, methods of patterning low-k dielectric films have been disclosed. In accordance with an embodiment of the present invention, a method includes forming and patterning a mask layer above a low-k dielectric layer, the low-k dielectric layer disposed above a substrate. Exposed portions of the low-k dielectric layer are modified with a plasma process. The modified portions of the low-k dielectric layer are removed selective to the mask layer and unmodified portions of the low-k dielectric layer. In one embodiment, modifying exposed portions of the low-k dielectric layer with the plasma process comprises removing carbon atoms from the exposed portions of the low-k dielectric layer. In one embodiment, removing the modified portions of the low-k dielectric layer comprises exposing the low-k dielectric layer to a second plasma process.

What is claimed is:

1. A method of patterning a low-k dielectric film, the method comprising:

forming and patterning a mask layer above a low-k dielectric layer to provide exposed and unexposed portions of the low-k dielectric layer, the low-k dielectric layer disposed above a substrate;

modifying a surface of the exposed portions of the low-k dielectric layer with a first plasma process without modifying the unexposed portions of the low-k dielectric layer;

removing the modified surface of the exposed portions of the low-k dielectric layer selective to the mask layer and to the unmodified unexposed portions of the low-k dielectric layer; and repeating the modifying and the removing one or more times to form one or more trenches in the low-k dielectric layer.

2. The method of claim 1, wherein modifying the surface of the exposed portions of the low-k dielectric layer with the first plasma process comprises removing carbon atoms from the surface of the exposed portions of the low-k dielectric layer.

3. The method of claim 1, wherein modifying the surface of the exposed portions of the low-k dielectric layer with the first plasma process comprises increasing the dielectric constant of the surface of the exposed portions of the low-k dielectric layer.

4. The method of claim 1, wherein modifying the surface of the exposed portions of the low-k dielectric layer with the first plasma process comprises using a plasma generated from a gas selected from the group consisting of helium (He), Xenon (Xe), nitrogen ($N_2$), and argon (Ar).

5. The method of claim 1, wherein removing the modified surface of the exposed portions of the low-k dielectric layer comprises using a second plasma process.

6. The method of claim 5, wherein the second plasma process comprises a plasma generated from a gas selected from the group consisting of $NF_3$, ammonia ($NH_3$), or a combination thereof.

7. The method of claim 1, wherein removing the modified surface of the exposed portions of the low-k dielectric layer comprises using a vapor selected from the group consisting of hydrogen fluoride (HF) vapor and $NF_3.HF$ vapor.

8. The method of claim 1, wherein the modifying and the removing are performed in a same process chamber without removing the substrate from the process chamber between the modifying and the removing.

9. The method of claim 1, wherein forming and patterning the mask layer above the low-k dielectric layer comprises forming and patterning a non-oxide mask layer.

\* \* \* \* \*